(12) United States Patent
Takabayashi

(10) Patent No.: US 10,787,182 B2
(45) Date of Patent: Sep. 29, 2020

(54) VEHICLE CONTROL DEVICE

(71) Applicant: MITSUBISHI ELECTRIC CORPORATION, Chiyoda-ku, Tokyo (JP)

(72) Inventor: Hirokazu Takabayashi, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 98 days.

(21) Appl. No.: 16/071,274

(22) PCT Filed: Mar. 25, 2016

(86) PCT No.: PCT/JP2016/059562
§ 371 (c)(1),
(2) Date: Jul. 19, 2018

(87) PCT Pub. No.: WO2017/163392
PCT Pub. Date: Sep. 28, 2017

(65) Prior Publication Data
US 2019/0263429 A1    Aug. 29, 2019

(51) Int. Cl.
*B61C 17/12* (2006.01)
*H01L 23/34* (2006.01)
(Continued)

(52) U.S. Cl.
CPC .............. *B61C 17/12* (2013.01); *B61C 17/00* (2013.01); *H01L 23/34* (2013.01);
(Continued)

(58) Field of Classification Search
CPC ...... H05K 5/0073; H05K 5/0204; H05K 7/14; H05K 7/20845; H05K 7/20854;
(Continued)

(56) References Cited

U.S. PATENT DOCUMENTS

2013/0320826 A1* 12/2013 Ikemoto ................. B61C 17/00
                                                                           312/236
2014/0345492 A1  11/2014 Fujito et al.
(Continued)

FOREIGN PATENT DOCUMENTS

CN        105408183 A     3/2016
JP        2009241765 A   10/2009
(Continued)

OTHER PUBLICATIONS

International Search Report (PCT/ISA/210) dated Jun. 21, 2016, by the Japanese Patent Office as the International Searching Authority for International Application No. PCT/JP2016/059562.
(Continued)

*Primary Examiner* — Jacob R Crum
(74) *Attorney, Agent, or Firm* — Buchanan Ingersoll & Rooney PC

(57) ABSTRACT

An open part that has an opening surface that is perpendicular to the horizontal direction is formed in a housing of a vehicle control device. An interior of the housing is divided into a first space including the open part and a second space by a partitioning member, a main surface thereof having a hole formed therein and opposing the opening surface. The semiconductor cooling unit is housed in the first space. The semiconductor cooling unit is detachably attached in a direction in which the opening surface and the partitioning member oppose each other. An engaging member arranged on the cover of the semiconductor cooling unit engages a guide arranged on the housing, and the guide supports weight of the semiconductor cooling unit. A heat sink is provided on a base plate and forms a vertically-directed flow passage.

12 Claims, 12 Drawing Sheets

(51) Int. Cl.
  *B61C 17/00* (2006.01)
  *H05K 7/14* (2006.01)
  *H05K 7/20* (2006.01)
  *H01L 23/40* (2006.01)

(52) U.S. Cl.
  CPC ........... *B60L 2200/26* (2013.01); *H01L 23/40* (2013.01); *H05K 7/14* (2013.01); *H05K 7/209* (2013.01); *H05K 7/20854* (2013.01)

(58) Field of Classification Search
  CPC .. H05K 7/20863; H05K 7/2089; H05K 7/209; H05K 7/20909; H01L 23/34; H01L 23/40; B60L 2200/26; B61C 17/12; B61C 17/00
  See application file for complete search history.

(56) References Cited

U.S. PATENT DOCUMENTS

| | | | |
|---|---|---|---|
| 2015/0048675 A1* | 2/2015 | Fujii | B60L 50/51 307/10.1 |
| 2015/0062811 A1 | 3/2015 | Suzuki et al. | |
| 2015/0201533 A1* | 7/2015 | Daughtry, Jr. | H05K 9/0028 174/377 |
| 2016/0143193 A1* | 5/2016 | Ono | H05K 7/20 361/692 |
| 2016/0352242 A1* | 12/2016 | Takabayashi | H02M 7/003 |

FOREIGN PATENT DOCUMENTS

| | | |
|---|---|---|
| JP | 2012-136221 A | 7/2012 |
| JP | 2013-118770 A | 6/2013 |
| JP | 2013-163503 A | 8/2013 |
| JP | 5461613 B2 | 4/2014 |
| WO | 2015/029276 A1 | 3/2015 |

OTHER PUBLICATIONS

Written Opinion (PCT/ISA/237) dated Jun. 21, 2016, by the Japanese Patent Office as the International Searching Authority for International Application No. PCT/JP2016/059562.

Office Action dated May 23, 2019, by the Chinese Patent Office in corresponding Chinese Patent Application No. 201680083785.0 and English translation of the Office Action. (12 pages).

Office Action dated Feb. 19, 2020, issued in the corresponding Indian Patent Application No. 201847033479, 5 pages.

\* cited by examiner

VEHICLE CONTROL DEVICE

TECHNICAL FIELD

The present disclosure relates to a vehicle control device equipped with a detachably attached semiconductor cooling unit.

BACKGROUND ART

Although a vehicle control device is equipped with a semiconductor cooling unit for cooling semiconductor elements, the semiconductor cooling unit is heavy, and the semiconductor cooling unit is difficult to attach to and detach from the vehicle control device.

In a vehicle control device disclosed in Patent Literature 1, a flange that supports both ends of a semiconductor cooling device is provided for a bottom plate frame upon which the semiconductor cooling device is mounted, and an open part having a width narrower than the semiconductor cooling device is formed in the bottom plate frame. Attachment of the semiconductor cooling device to the vehicle control device is easily performed by adjusting height of an elevating cart, carrying both ends of the semiconductor cooling device on the flange, and moving the elevating cart.

CITATION LIST

Patent Literature

Patent Literature 1: Unexamined Japanese Patent Application Kokai Publication No. 2012-136221

SUMMARY OF INVENTION

Technical Problem

In the vehicle control device disclosed in Patent Literature 1, the flange provided for the bottom plate frame blocks a portion of a passage for flow of external air into the semiconductor cooling device. Thus such configuration has a problem in that cooling capacity of the semiconductor cooling device declines.

In consideration of the aforementioned circumstances, an objective of the present disclosure is to improve cooling capacity of the semiconductor cooling unit occurring in the vehicle control device.

Solution to Problem

In order to attain the aforementioned objective, the vehicle control device of the present disclosure includes a housing for mounting on a vehicle a semiconductor cooling unit, and a guide. In the housing an open part is formed that has an opening surface disposed in a plane intersecting a horizontal direction. The semiconductor cooling unit is housed in a space of an interior of the housing and is detachably attached via the opening surface. The guide is arranged on a surface of the housing enclosing the space, and has a shape that extends in an attachment-detachment direction of the semiconductor cooling unit. In a lower side of the housing enclosing the space, an inflow port is formed for inflow of air from the exterior of the housing. In an upper side of the housing enclosing the space, an outflow port is formed for discharge of air from the interior of the housing. The semiconductor cooling unit includes a base plate, a heat sink, a cover, and an engaging member. The semiconductor element is attached to the base plate. The heat sink is formed on the base plate on a side thereof facing the opening surface and opposite to the surface on which the semiconductor element is attached, and forms a vertically-directed flow passage for air inflowing from the inflow port. The cover covers at least a portion of the heat sink, and through holes are formed in at least a portion of the cover. The engaging member is provided on the cover, has a shape that extends in the attachment-detachment direction and engages the guide, and moves along the guide in the attachment-detachment direction.

Advantageous Effects of Invention

According to the present disclosure, the engaging member arranged on the cover of the semiconductor cooling unit engages the guide arranged on the surface of the housing, and thus the guide can support the weight of the semiconductor cooling unit without blocking of the inflow port related to the engaging, and further, the cooling capacity of the semiconductor cooling unit in the vehicle control device can improve.

DESCRIPTION OF EMBODIMENTS

Figure 1:
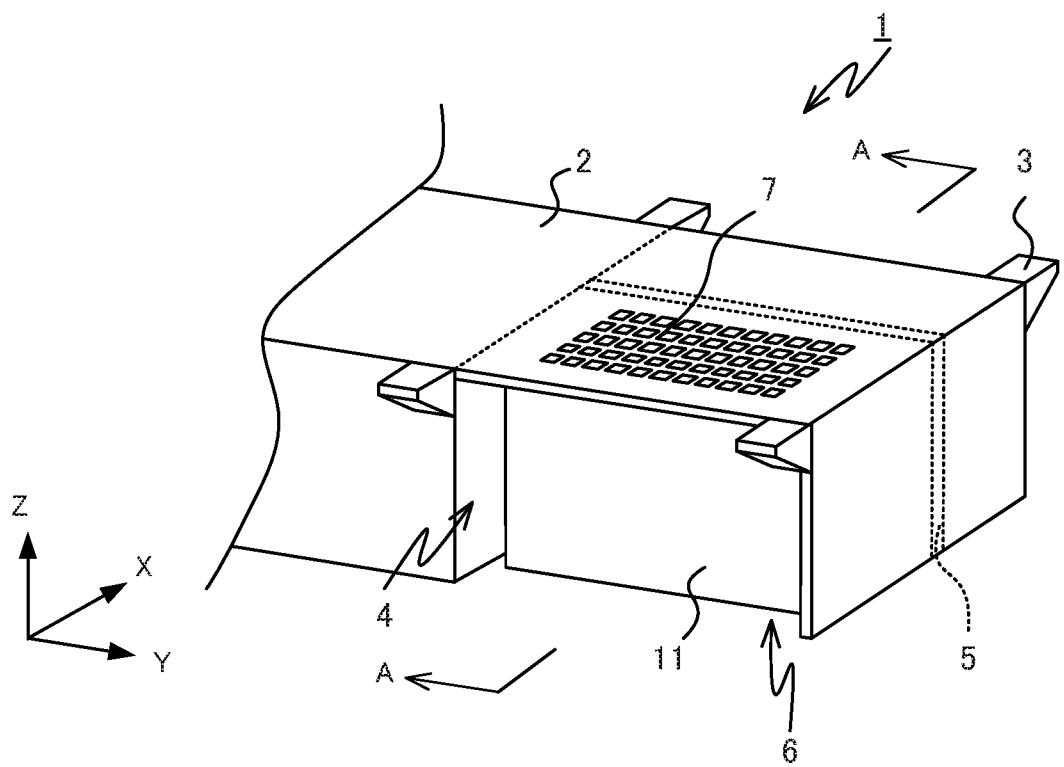
FIG. 1 is a perspective view of a vehicle control device according to Embodiment 1 of the present disclosure.

Embodiments of the present description are described below in detail with reference to drawings. In the drawings, components that are the same or equivalent are assigned the same reference signs.

Embodiment 1

Figure 2:
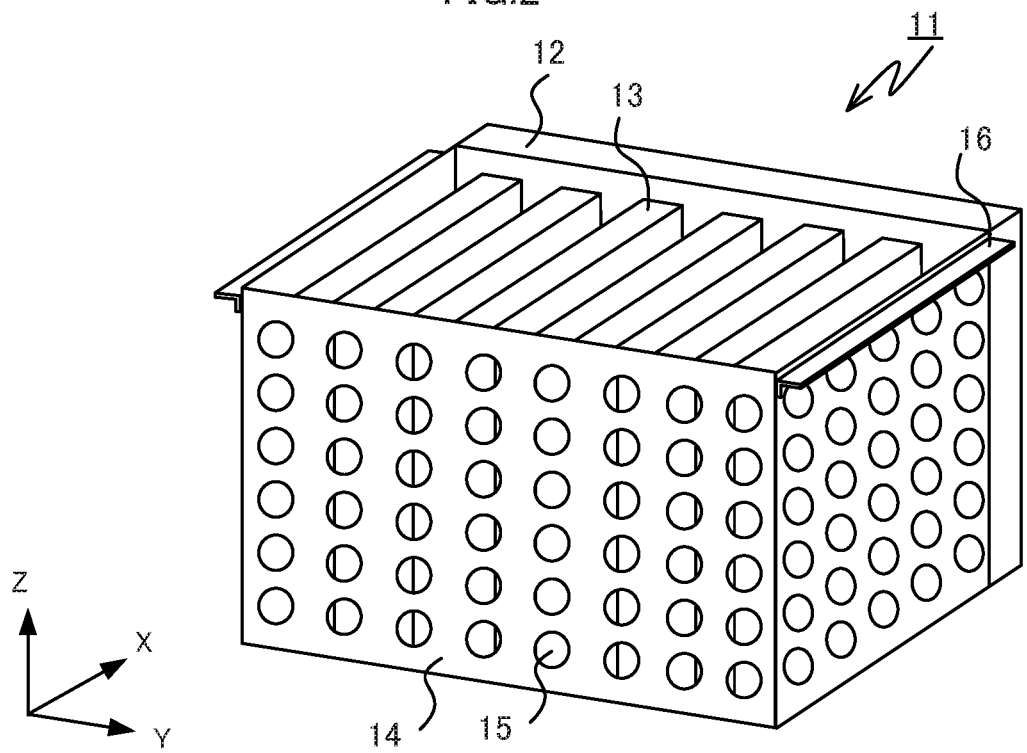
FIG. 2 is a perspective view of a semiconductor cooling unit according to Embodiment 1.
Figure 3:
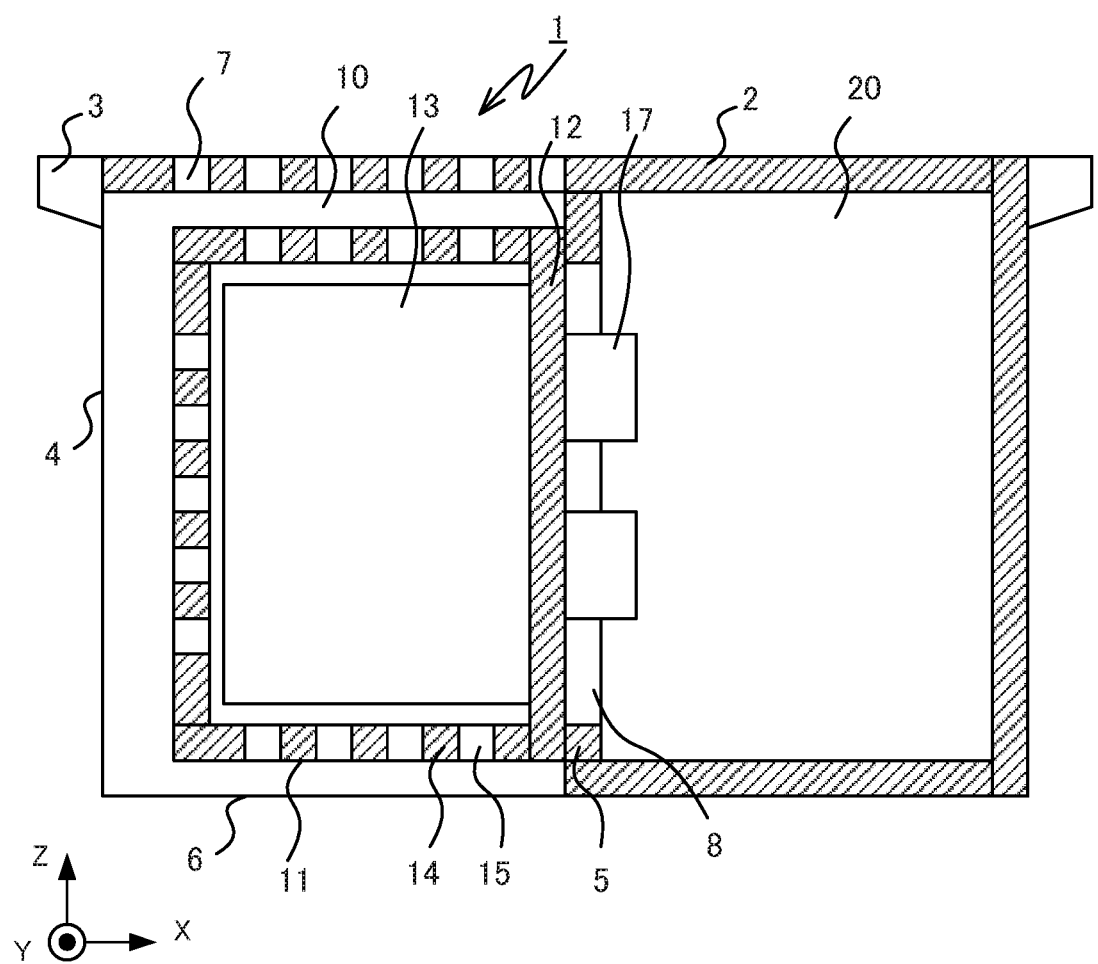
FIG. 3 is a cross-sectional drawing of the vehicle control device according to Embodiment 1.

FIG. 1 is a perspective view of a vehicle control device according to Embodiment 1 of the present disclosure. A vehicle control device (referred to hereinafter as the control device) 1 is mounted on a vehicle such as a railway vehicle. FIG. 2 is a perspective view of a semiconductor cooling unit according to Embodiment 1. FIG. 3 is a cross-sectional drawing of the vehicle control device according to Embodiment 1. FIG. 3 is a cross-sectional drawing taken along line A-A in FIG. 1. In Embodiment 1, the vertical direction is taken to be the Z-axis direction, the travel direction of the vehicle is taken to be the Y-axis direction, and the widthwise direction of the vehicle, which is the railroad tie direction if the vehicle is a railway vehicle, is taken to be the X-axis direction. The vehicle proceeds in the positive Y-axis direction or the negative Y-axis direction. In Embodiment 1, the control device 1 is attached below the floor of the vehicle body of the vehicle, and thus the vehicle body is positioned upward of the control device 1 in the vertical direction. The direction of attachment of the control device 1 to the vehicle body is not limited to the example illustrated in FIG. 1, the Y-axis direction may be the railroad tie direction, and the vehicle may move in the positive X-axis direction or the negative X-axis direction.

The control device 1 includes a housing 2 attached to the vehicle body by a hanging member 3. An open part 4 having an opening surface thereof perpendicular to the X-axis is formed in the housing 2. The interior of the housing 2 is partitioned by a partitioning member 5 into a first space 10 and a second space 20, the first space 10 includes the open part 4, and a hole 8 is formed in a main surface of the partitioning member 5, which opposes the open part 4. A semiconductor cooling unit (referred to hereinafter as a cooling unit) 11 is housed in the first space 10. The second space 20 houses electronic components such as power conversion apparatuses, for example, converters or inverters. An inflow port 6, for inflow of air from the exterior of the housing 2, is formed in the lower side of the housing 2 enclosing the first space 10. An outflow port 7, for discharge of air of the interior of the housing 2, is formed in the upper side of the housing 2 enclosing the second space 20. In Embodiment 1, among the surfaces of the housing 2 enclosing the first space 10, the bottom surface, which is the surface of the lower side in the vertical direction, is an opening, and the opening is the inflow port 6. In Embodiment 1, the outflow port 7 is formed in the upper surface, which is the upper side in the vertical direction, of the housing 2 enclosing the first space 10. The shapes of the inflow port 6 and the outflow port 7 are freely selected, the inflow port 6 and the outflow port 7 may be both made as openings, the inflow port 6 may be formed in a lower surface of the two surfaces perpendicular to the horizontal direction of the housing 2, and the outflow port 7 may be formed in an upper surface of the two surfaces.

The cooling unit 11 is detachably attached in the direction of opposition between the opening surface of the open part 4 and the partitioning member 5. Weight of the cooling unit 11 is supported by the below-described guide provided for the housing 2. The cooling unit 11 includes: a semiconductor element 17, a base plate 12 to which the semiconductor element 17 is attached, a heat sink 13 formed on the base plate 12, a cover 14, and an engaging member 16 arranged on the cover 14. The semiconductor element 17 is housed in the second space 20 and is electrically connected to a non-illustrated electronic component. The semiconductor element 17 is attached to the base plate 12, and the heat sink 13 is formed on the surface of the side of the base plate 12 opposite to the surface to which the semiconductor element is attached. The heat sink 13 forms a flow passage for air directed in the positive Z-axis direction. The cover 14 covers at least a portion of the heat sink 13, and through holes 15 are formed in at least a portion of the cover 14. The engaging member 16 is arranged on the cover 14, has a shape that engages the guide and extends in the attachment-detachment direction, and moves in the attachment-detachment direction along the guide.

In Embodiment 1, the heat sink 13 is fin-shaped, although the shape of the heat sink 13 may be any freely selected shape that forms the flow passage for air directed in the positive Z-axis direction. In Embodiment 1, the cover 14 covers the entire heat sink 13, and has through holes 15 formed in all the surfaces of the cover 14. The shapes of the cover 14 and the housing 2 are not limited to the aforementioned example. For example, the bottom surface of the cover 14 may be an opening, and an opening functioning as the inflow port 6 may be arranged at the bottom surface of the housing 2 enclosing the first space 10.

As illustrated in FIG. 3, in the state in which the cooling unit 11 is housed in the first space 10, the base plate 12 is disposed covering the hole 8 of the partitioning member 5 in a state in which the semiconductor element 17 is exposed to the second space 20 from the hole 8 of the partitioning member 5. Due to covering of the hole 8 of the partitioning member 5 by the base plate 12, air from the exterior of the housing 2 does not flow into the second space 20.

Figure 4:
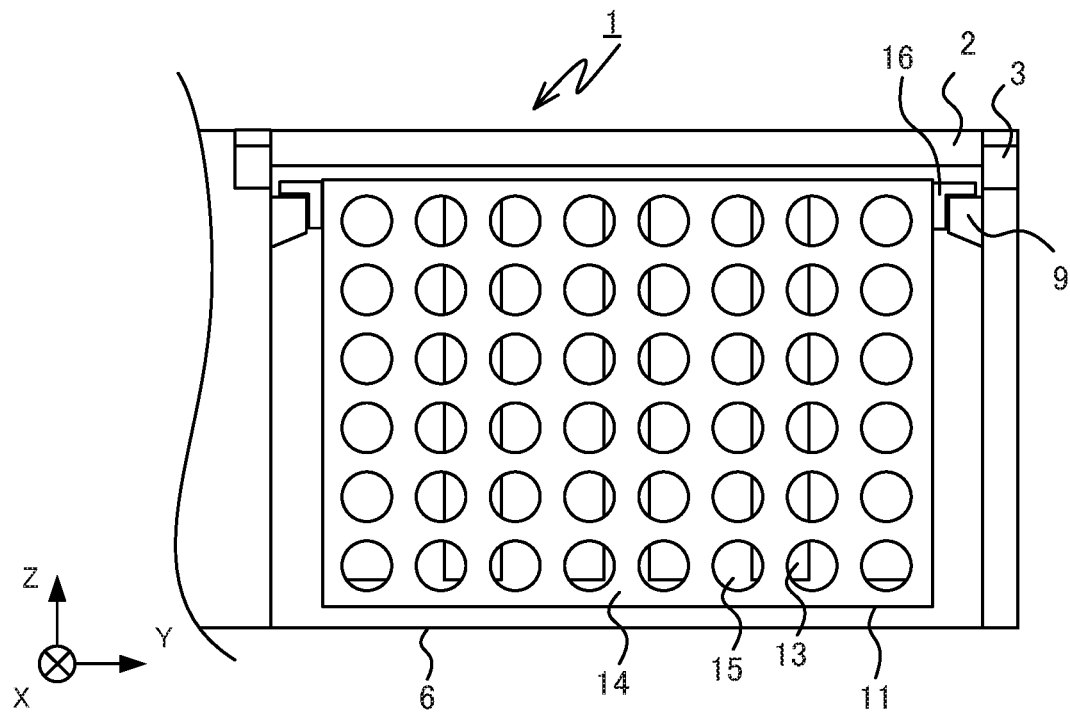
FIG. 4 is a front view of the vehicle control device according to Embodiment 1.

FIG. 4 is a front view of the vehicle control device according to Embodiment 1. At the surface of the housing 2 enclosing the first space 10, the guide 9 is arranged that has a shape that extends in the attachment-detachment direction of the cooling unit 11 and that supports the weight of the cooling unit 11. In Embodiment 1, among the surfaces of the housing 2 enclosing the first space 10, the guide 9 is arranged on each of two surfaces opposing each other in the Y-axis direction, and the guides 9 are slide rails. In Embodiment 1, the engaging member 16 is a slider that engages the guide 9 and moves in the attachment-detachment direction on the guide 9 that is a slide rail.

Figure 5:
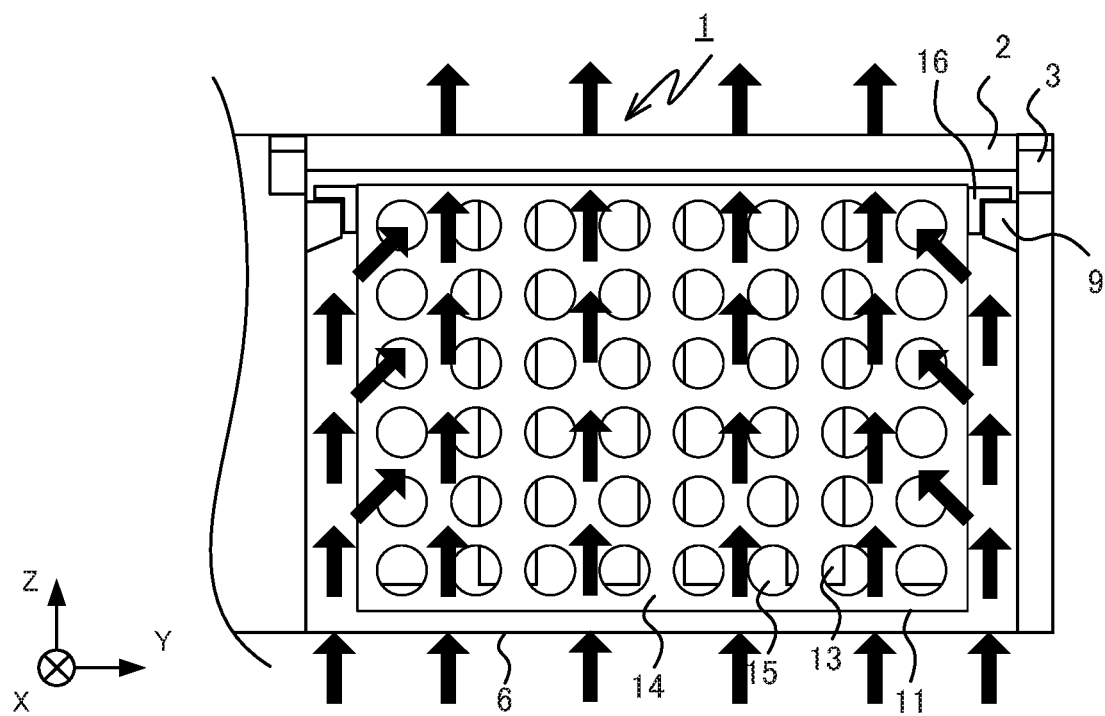
FIG. 5 is a drawing illustrating flow of air occurring in the vehicle control device according to Embodiment 1.

FIG. 5 is a drawing illustrating flow of air occurring in the vehicle control device according to Embodiment 1. The flow of air in FIG. 5 is indicated by the black arrows. Air flowing into the first space 10 of the interior of the housing 2 from the inflow port 6 flows into the cooling unit 11, passes through the heat sink 13, is discharged from the cooling unit 11, and is discharged to the exterior of the housing 2 from the outflow port 7. The space occurring between the cooling unit 11 and the housing 2 in the Y-axis direction is only as wide as the Y-axis direction width of the guide 9 and the engaging member 16. While air moves in the positive Z-axis direction in this space, a portion of the air flows into the cooling unit 11. Such configuration thus suppresses heat released from the heat sink 13 from being transmitted to, among the surfaces of the housing 2 enclosing the first space 10, the two surfaces opposing each other in the Y-axis direction. While the air moves in the positive Z-axis direction between the cooling unit 11 and the housing 2, a portion of the air flows into the cooling unit 11, and thus air that has not exchanged heat flows into the flow-downstream side of the cooling unit 11. Thus the temperature difference between the flow-upstream side and the flow-downstream side can be decreased.

Figure 6:
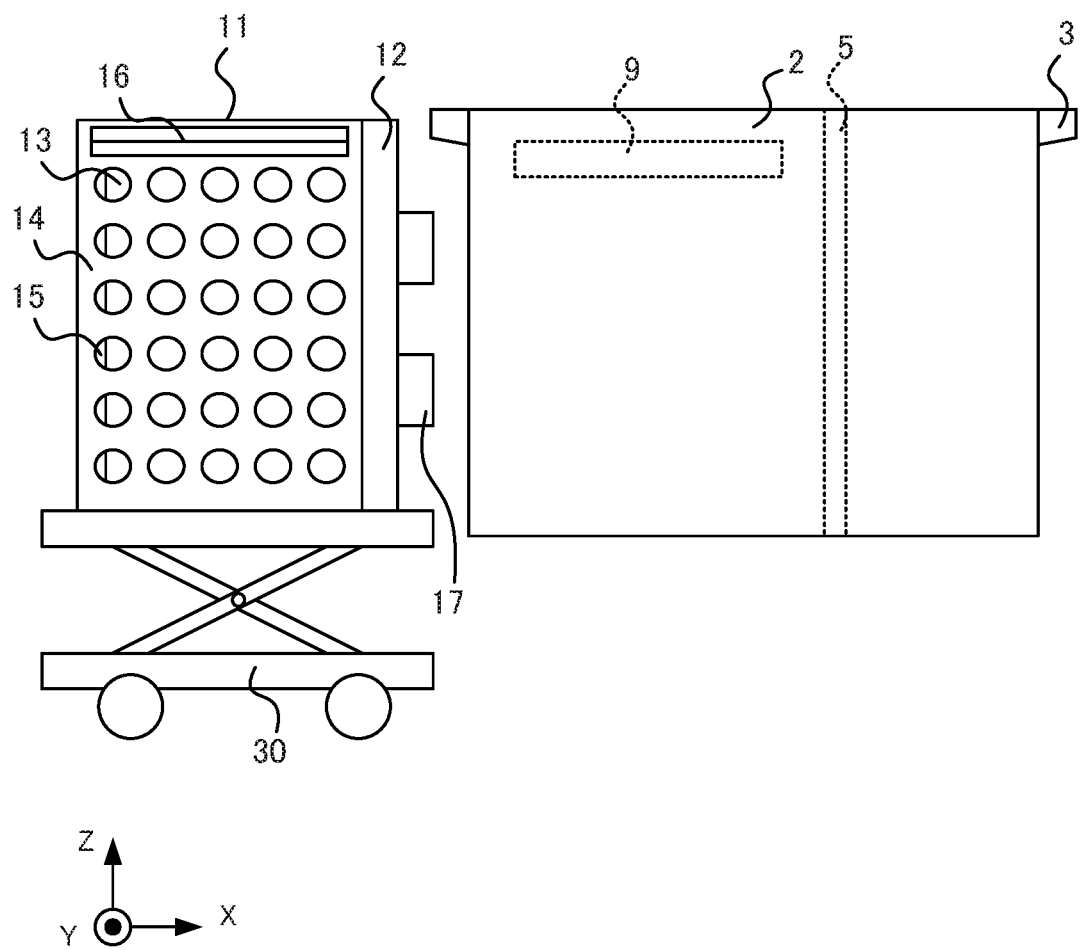
FIG. 6 is a drawing illustrating attachment of the semiconductor cooling unit according to Embodiment 1.
Figure 7:
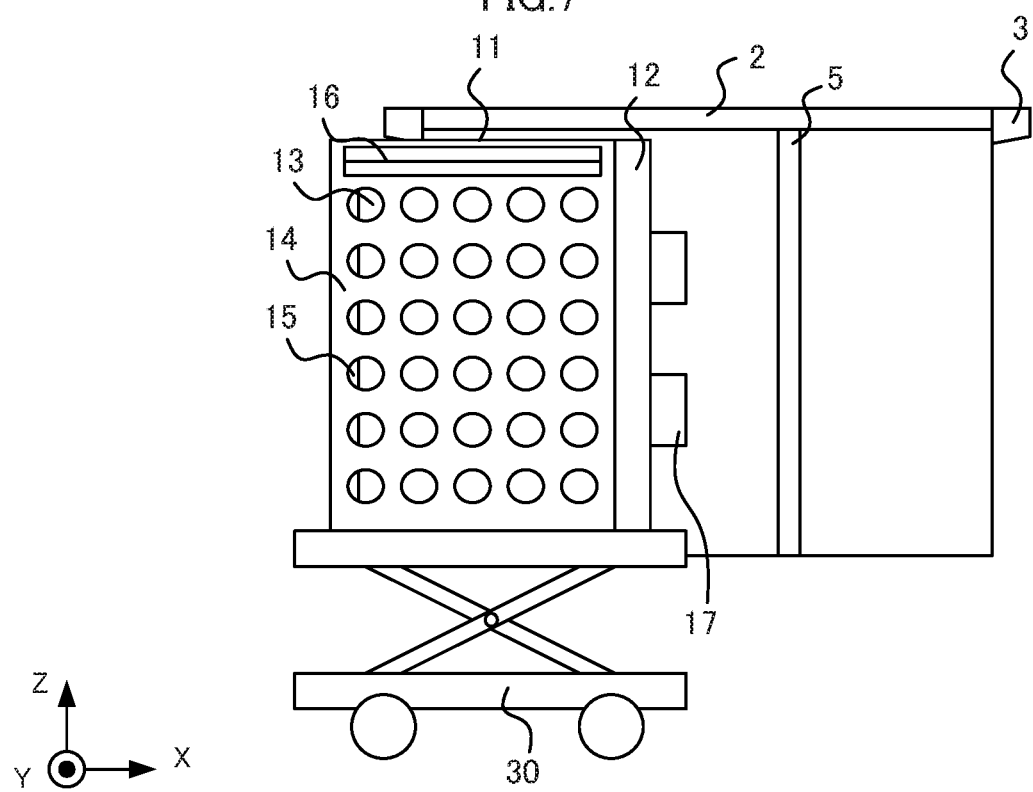
FIG. 7 is a drawing illustrating attachment of the semiconductor cooling unit according to Embodiment 1.
Figure 8:
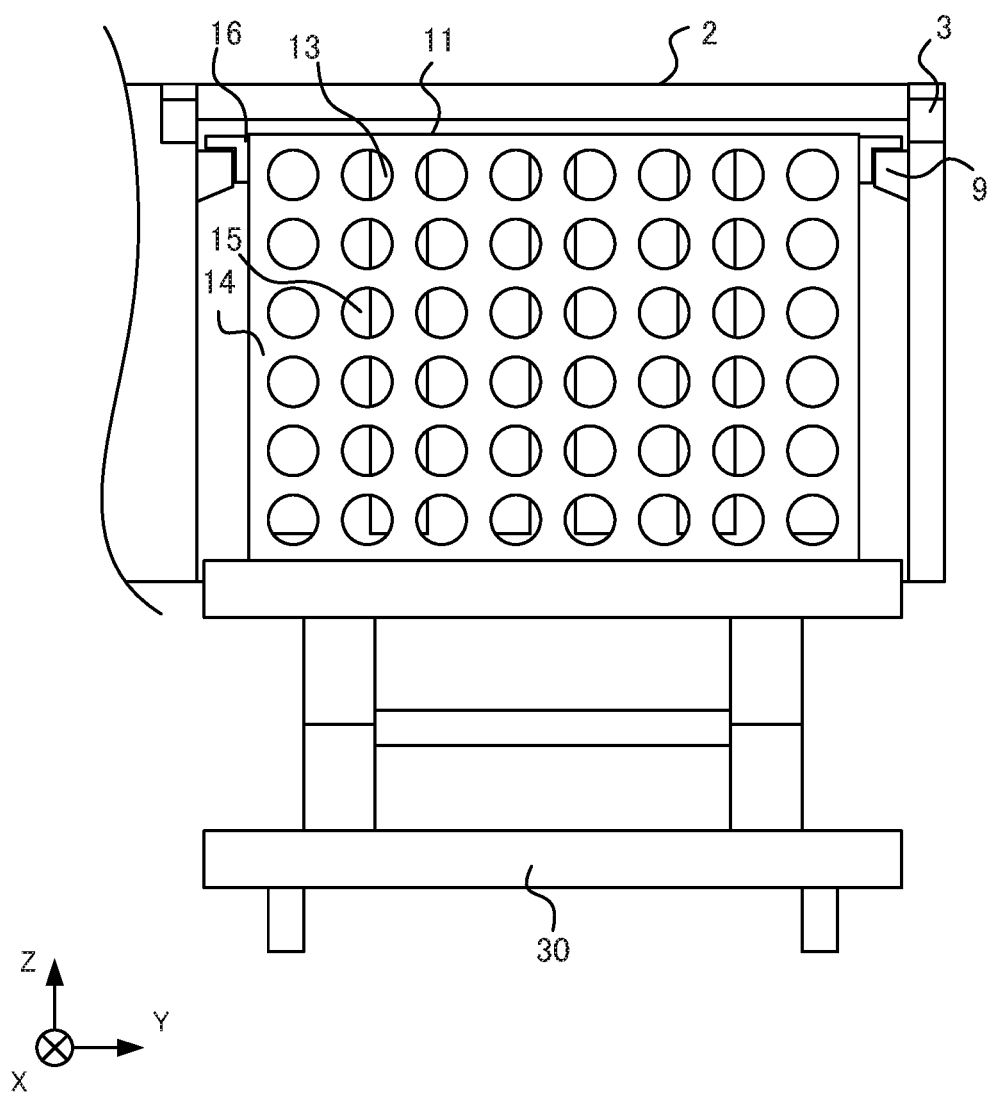
FIG. 8 is a drawing illustrating attachment of the semiconductor cooling unit according to Embodiment 1.

FIGS. 6 to 8 are drawings illustrating attachment of the semiconductor cooling unit according to Embodiment 1. The cooling unit 11 is heavy, and thus the worker who attaches the cooling unit 11, as illustrated in FIG. 6, carries the cooling unit 11 on an elevating cart 30, and moves the elevating cart 30 to the vicinity of the open part 4. In Embodiment 1, the surface of the vertical-direction lower side of the housing 2 enclosing the first space 10 is an opening, and the opening is the inflow port 6. Thus the worker, as illustrated in FIG. 7, can move the elevating cart 30 from the state illustrated in FIG. 6 further in the positive X-axis direction. In FIG. 7, one of the surfaces of the housing 2 perpendicular to the Y-axis is not illustrated. FIG. 8 is a drawing of the FIG. 7 configuration as viewed in the positive X-axis direction. Due to the occurrence of the space between the cooling unit 11 and the housing 2 in the Y-axis direction, the Y-axis direction width of the elevating cart 30 can be increased to a width wider than the cooling unit 11 in the Y-axis direction. This increase in width enables suppression of upsetting of the elevating cart 30 carrying the cooling unit 11 during movement of the elevated cart 30.

Figure 9:
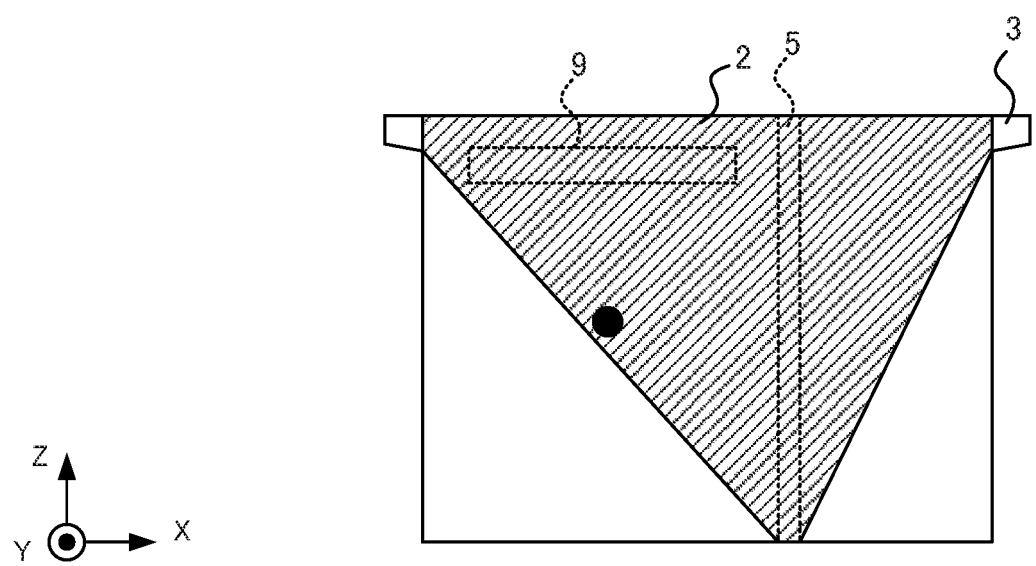
FIG. 9 is a drawing illustrating a range of reinforcement of a housing of the vehicle control device according to Embodiment 1.

FIG. 9 is a drawing illustrating a range of reinforcement of the housing of the vehicle control device according to Embodiment 1. In FIG. 9, a black round dot indicates the center of gravity of the cooling unit 11 in a state in which the cooling unit 11 is housed in the first space 10. In Embodiment 1, the vertical-direction position of the guide 9 is higher than the vertical-direction position of the center of gravity of the cooling unit 11 in a state in which the cooling unit 11 is housed in the first space 10. The guide 9 is arranged at the upper portion of the surface of the housing 2 perpendicular to the Y-axis direction, and thus reinforcement of the entire surface of the housing 2 perpendicular to the Y-axis direction is not required. For example, as illustrated by the portion indicated by tilted lines in FIG. 9, reinforcing just a portion of the surface of the housing 2 perpendicular to the Y-axis direction enables support of the weight of the cooling unit 11. Just a portion of the surface of the housing 2 perpendicular to the Y-axis direction is reinforced, and thus manufacturing cost can be reduced.

For example, when the elevating cart 30 cannot be moved to the vertical-direction lower side of the control device 1 due to the presence of a rail track, after moving the elevating cart 30 to the vicinity of the open part 4, the worker engages a portion of the engaging member 16 to the guide 9. Thereafter, the worker is required to push the cooling unit 11 so that the cooling unit 11 moves in the positive X-axis direction. The vertical-direction position of the guide 9 is higher than the vertical-direction position of the center of gravity of the cooling unit 11 in a state in which the cooling unit 11 is housed in the first space 10, and thus when the cooling unit 11 is moved in the positive X-axis direction in the first space 10, upsetting of the cooling unit 11 can be suppressed. In a similar manner, upsetting of the cooling unit 11 can be suppressed when the cooling unit 11 is moved in the negative X-axis direction in the first space 10 in order to remove the cooling unit 11.

Figure 10:
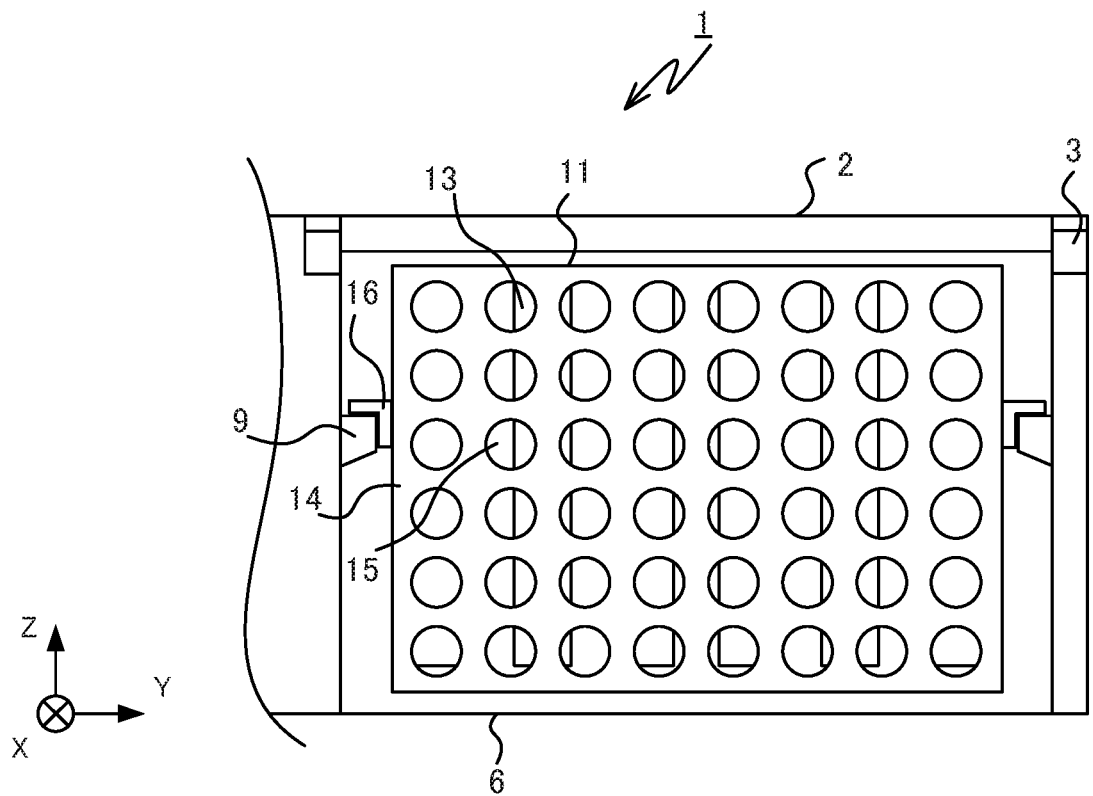
FIG. 10 is a front view of a modified example of the vehicle control device according to Embodiment 1.

FIG. 10 is a front view of a modified example of the vehicle control device according to Embodiment 1. The Z-axis direction positions of the guide 9 and the engaging member 16 can be freely determined. A space occurs between the cooling unit 11 and the housing 2 in the Y-axis direction also in the example of FIG. 10, and thus the Y-axis direction width of the elevating cart 30 can be made greater than the Y-axis direction width of the cooling unit 11. Thus in a manner similar to that described above, upsetting can be suppressed when moving the elevating cart 30 carrying the cooling unit 11. Further, also in the example of FIG. 10, the vertical-direction position of the guide 9 is higher than the vertical-direction position of the center of gravity of the cooling unit 11 in a state in which the cooling unit 11 is housed in the first space 10, and thus reinforcing the entire surface of the housing 2 perpendicular to the Y-axis direction is not required. Thus manufacturing cost can be reduced in a manner similar to that of the aforementioned example. Further, upsetting of the cooling unit 11 can be suppressed when moving the cooling unit 11 in the first space 10 in the X-axis direction.

Figure 11:
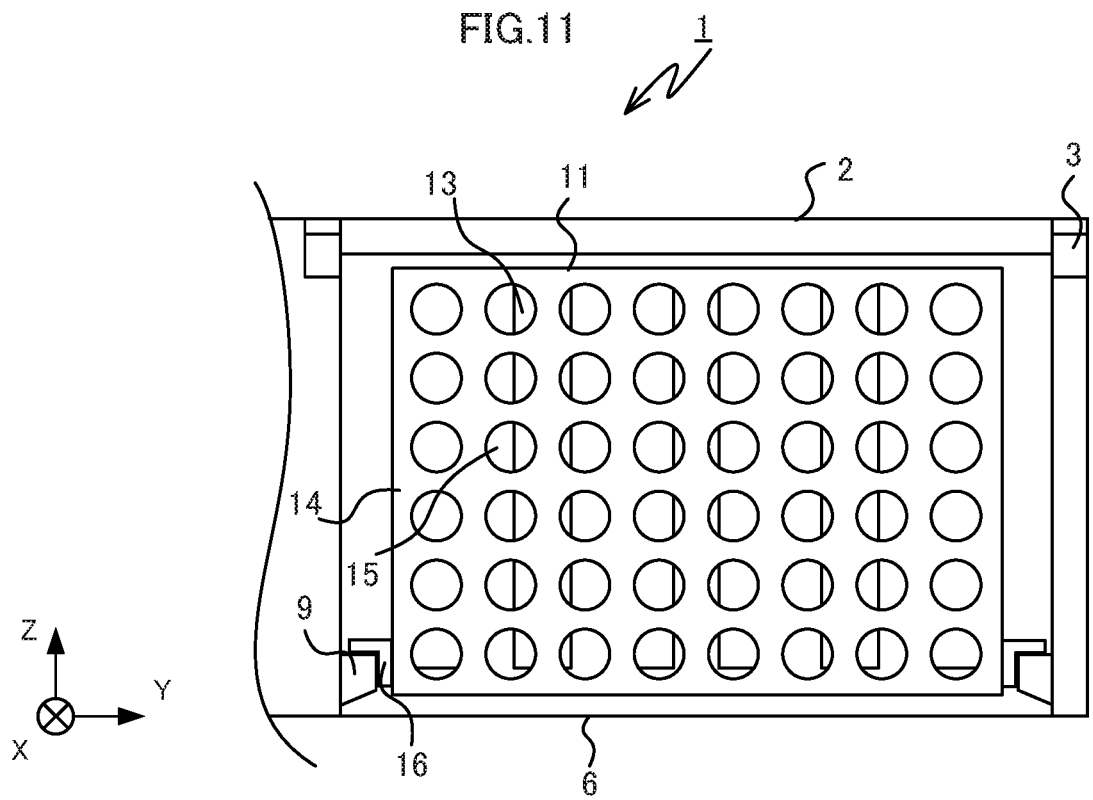
FIG. 11 is a front view of a modified example of the vehicle control device according to Embodiment 1.

FIG. 11 is a front view of a modified example of the vehicle control device according to Embodiment 1. Also in the example of FIG. 11, a space occurs between the cooling unit 11 and the housing 2 in the Y-axis direction, and thus the Y-axis direction width of the elevating cart 30 can be made greater than the Y-axis direction width of the cooling unit 11. Thus in a manner similar to the described above, upsetting can be suppressed when moving the elevating cart 30 carrying the cooling unit 11.

As described above, according to the control device 1 of Embodiment 1 of the present disclosure, the engaging member 16 arranged on the cover 14 engages the guide 9 arranged on the surface of the housing 2, and thus arrangement of a flange at the surface of the vertical-direction lower side for supporting the weight of the cooling unit 11 is not required, and cooling capacity of the cooling unit 11 occurring in the control device 1 can be improved. Also since a space occurs between the cooling unit 11 and the housing 2 in the Y-axis direction, the Y-axis direction width of the elevating cart 30 can be made greater than the Y-axis direction width of the cooling unit 11, and thus upsetting can be suppressed when moving the elevating cart 30 carrying the cooling unit 11. In the case in which the vertical-direction position of the guide 9 is higher than the vertical-direction position of the center of gravity of the cooling unit 11 in a state in which the cooling unit 11 is housed in the first space 10, there is no requirement for reinforcing the entire surface of the housing 2 perpendicular to the Y-axis direction, manufacturing cost can be reduced, and upsetting of the cooling unit 11 can be suppressed while moving the cooling unit 11 in the first space 10 in the X-axis direction.

Embodiment 2

Figure 12:
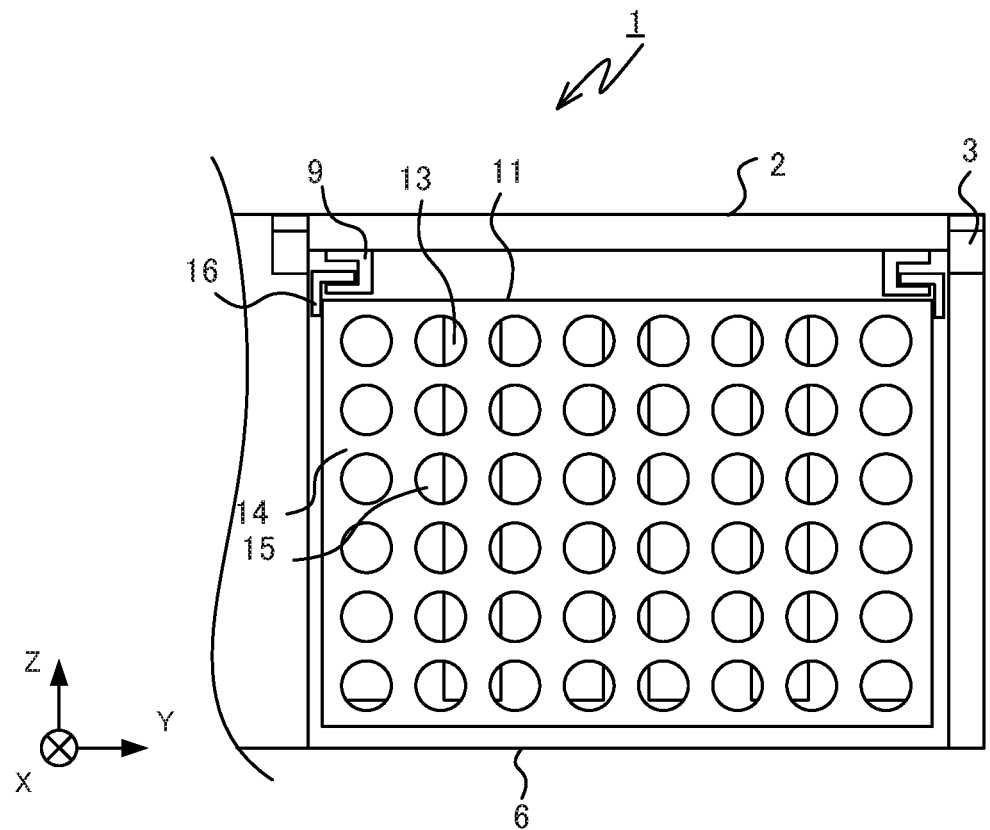
FIG. 12 is a front view of a vehicle control device according to Embodiment 2 of the present disclosure.
Figure 13:
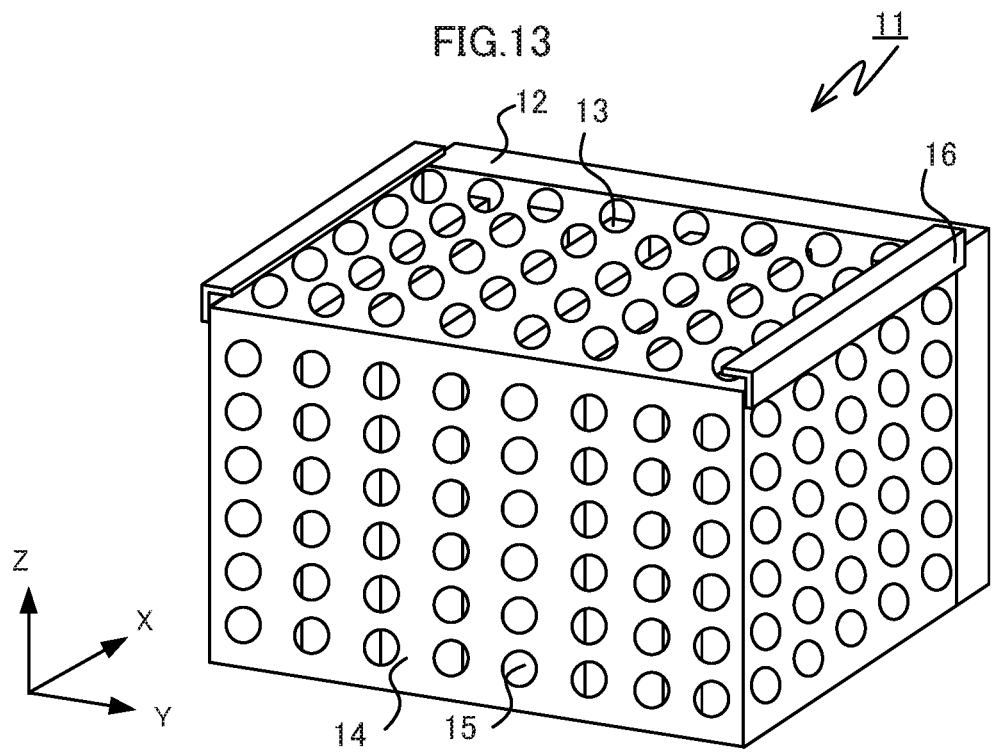
FIG. 13 is a perspective view of a semiconductor cooling unit according to Embodiment 2.

FIG. 12 is a front view of a vehicle control device according to Embodiment 2 of the present disclosure. FIG. 13 is a perspective view of the semiconductor cooling unit according to Embodiment 2. The control device 1 according to Embodiment 2 includes a guide 9 and an engaging member 16 that are shaped differently from the case of Embodiment 1. Among the surfaces of the housing 2 enclosing the first space 10, the guide 9 is a slide rail arranged on a vertical-direction upper side surface. The engaging member 16 is a slider that moves in the attachment-detachment direction on the guide 9 that is a slide rail, and the engaging member 16 engages the guide 9. The engaging member 16 has a shape that extends toward the vertical-direction upper side from the surface of the cover 14 perpendicular to the Y-axis. Due to arrangement of the guide 9 at the vertical-direction upper side surface, even when the width in the Y-axis direction is limited, disposal of the control device 1 according to Embodiment 2 is enabled.

Figure 14:
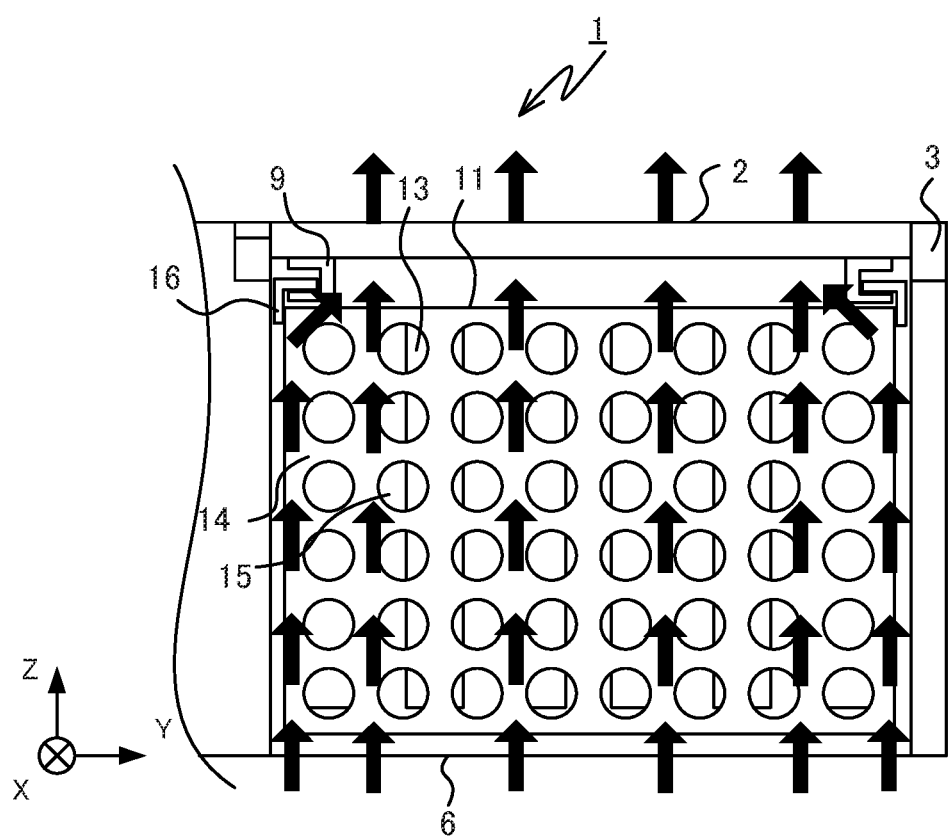
FIG. 14 is a drawing illustrating flow of air occurring in the vehicle control device according to Embodiment 2.

FIG. 14 is a drawing illustrating flow of air occurring in the vehicle control device according to Embodiment 2. In a manner similar to that of Embodiment 1, air flowing into the first space 10 of the interior of the housing 2 from the inflow port 6 flows into the cooling unit 11, passes through the heat sink 13, is discharged from the cooling unit 11, and is discharged to the exterior of the housing 2 from the outflow port 7. Due to the Y-axis direction width of the space between the cooling unit 11 and the housing 2 in the Y-axis direction being narrow in comparison to Embodiment 1, the amount of air passing through this space decreases; and while the air moves in the positive Z-axis direction in this space, a portion of the air flows into the cooling unit 11. Such configuration thus suppresses heat released from the heat sink 13 from being transmitted to, among the surfaces of the housing 2 enclosing the first space 10, the two surfaces opposing each other in the Y-axis direction. While the air moves in the positive Z-axis direction between the cooling unit 11 and the housing 2, a portion of the air flows into the cooling unit 11, and thus air that has not performed heat exchange flows to the flow-downstream side of the cooling unit 11. Thus the temperature difference between the flow-upstream side and the flow-downstream side can be decreased.

Although the Y-axis direction gap between the cooling unit 11 and the housing 2 is small in comparison to the case of Embodiment 1, the Y-axis direction width of the elevating cart 30 can be increased to greater than the Y-axis direction width of the cooling unit 11. Thus upsetting when the elevated cart 30 carrying the cooling unit 11 is moved can be suppressed. The vertical-direction position of the guide 9 arranged on the vertical-direction upper side surface of the housing 2 is higher than the vertical-direction position of the center of gravity of the cooling unit 11 in a state in which the cooling unit 11 is housed in the first space 10. Thus in a manner similar to that of Embodiment 1, during X-axis direction movement of the cooling unit 11 in the first space 10, upsetting of the cooling unit 11 can be suppressed.

As described above, according to the control device 1 of Embodiment 2 of the present disclosure, the engaging member 16 arranged on the cover 14 engages the guide 9 arranged on the vertical-direction upper side surface of the housing 2, and thus arrangement of a flange at the surface of the vertical-direction lower side for supporting the weight of the cooling unit 11 is not required, and cooling capacity of the cooling unit 11 occurring in the control device 1 can be improved. Since the vertical-direction position of the guide 9 arranged at the vertical-direction upper side surface of the housing 2 is higher than the vertical-direction position of the center of gravity of the cooling unit 11 in a state in which the cooling unit 11 is housed in the first space 10, when the cooling unit 11 is moved in the X-axis direction in the first space 10, upsetting of the cooling unit 11 can be suppressed.

Embodiment 3

Figure 15:
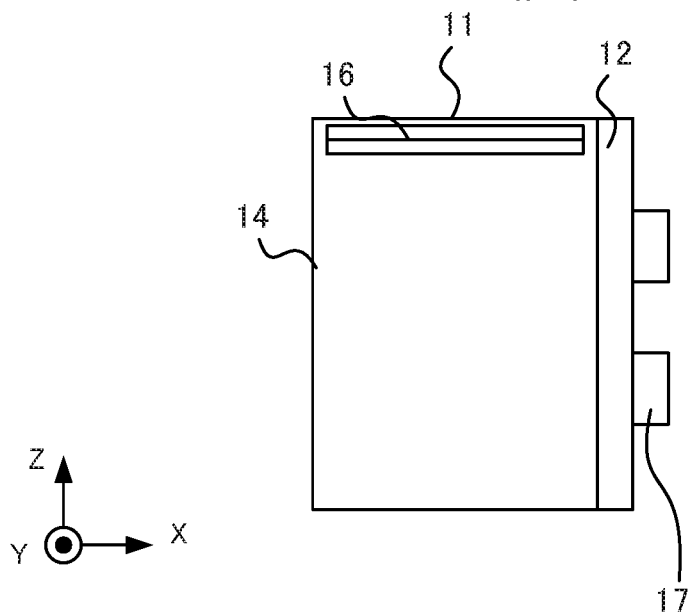
FIG. 15 is a side view of a semiconductor cooling unit according to Embodiment 3 of the present disclosure.
Figure 16:
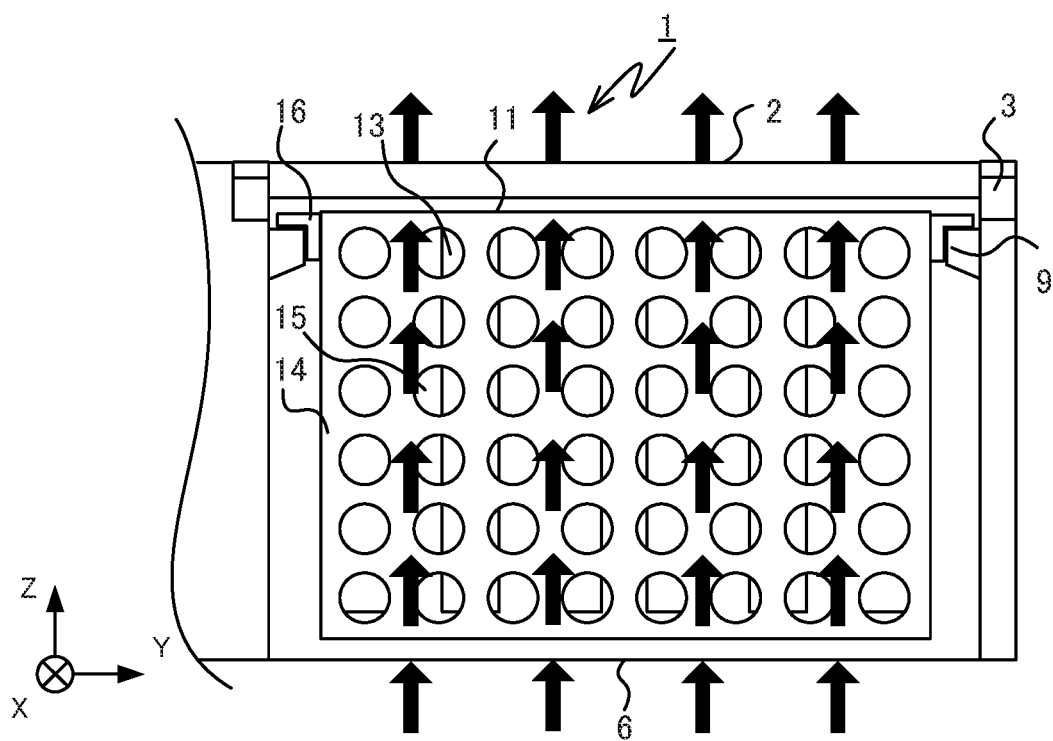
FIG. 16 is a drawing illustrating flow of air occurring in a vehicle control device according to Embodiment 3.

FIG. 15 is a side view of a semiconductor cooling unit according to Embodiment 3 of the present disclosure. The front view is similar to that of the cooling unit 11 according to Embodiment 1 illustrated in FIG. 4. FIG. 16 is a drawing illustrating flow of air occurring in the vehicle control device. Although the through holes 15 are formed in all surfaces of the cover 14 of the cooling unit 11 in Embodiment 1, in Embodiment 3, among the surfaces of the cover 14 of the cooling unit 11, the through holes 15 are not formed in the surfaces perpendicular to the Y-axis direction. Thus in contrast to Embodiment 1, air does not flow between the cooling unit 11 and the housing 2. However, air flowing into the first space 10 of the interior of the housing 2 from the inflow port 6 flows into the cooling unit 11, passes through the heat sink 13, is discharged from the cooling unit 11, and is discharged from the outflow port 7 to the exterior of the housing 2, thereby enabling cooling of the semiconductor element 17.

In the example of FIG. 16, a space occurs between the cooling unit 11 and the housing 2 in the Y-axis direction in a manner similar to that of the control device 1 according to Embodiment 1 illustrated in FIG. 4, and thus Y-axis direction width of the elevating cart 30 can be increased to greater than the Y-axis direction width of the cooling unit 11. Thus upsetting during moving of the elevating cart 30 carrying the cooling unit 11 can be suppressed.

In a manner similar to that of the control device 1 according to Embodiment 1 illustrated in FIG. 4, the vertical-direction position of the guide 9 in the example of FIG. 16 is higher than the vertical-direction position of the center of mass of the cooling unit 11 in a state in which the cooling unit 11 is housed in the first space 10. Due to arrangement of the guide 9 at the upper portion of the surface of the housing 2 perpendicular to the Y-axis direction, there is no requirement for reinforcing the entire surface of the housing 2 perpendicular to the Y-axis direction, and the weight of the cooling unit 11 can be supported by reinforcement of just a portion of the surface of the housing 2 perpendicular to the Y-axis direction. Due to reinforcing of just a portion of the surface of the housing 2 perpendicular to the Y-axis direction, manufacturing cost can be reduced. Further, in a manner similar to that of Embodiment 1, upsetting of the cooling unit 11 can be suppressed during moving of the cooling unit 11 in the first space 10 in the X-axis direction.

In a manner similar to that of the control device 1 according to Embodiment 1 illustrated in FIG. 10 and FIG. 11, the Z-axis direction positions of the guide 9 and the engaging member 16 can be freely determined for the control device 1 according to Embodiment 3.

As described above, according to the control device 1 of Embodiment 3 of the present disclosure, the engaging member 16 arranged on the cover 14 engages the guide 9 arranged on the surface of the housing 2, and thus arrangement of a flange at the surface of the vertical-direction lower side for supporting the weight of the cooling unit 11 is not required, and cooling capacity of the cooling unit 11 of the control device 1 can be improved. Further, a space occurs between the cooling unit 11 and the housing 2 in the Y-axis direction, and thus Y-axis direction width of the elevating cart 30 can be increased to greater than the Y-axis direction width of the cooling unit 11, and upsetting during moving of the elevating cart 30 carrying the cooling unit 11 can be suppressed. There is no requirement for reinforcing the entire surface of the housing 2 perpendicular to the Y-axis direction in the case in which the vertical-axis position of the guide 9 is higher than the vertical-axis position of the center of gravity of the cooling unit 11 in a state in which the cooling unit 11 is housed in the first space 10, manufacturing cost can be reduced, and upsetting of the cooling unit 11 can be suppressed during moving of the cooling unit 11 in the first space 10 in the X-axis direction.

Embodiment 4

Figure 17:
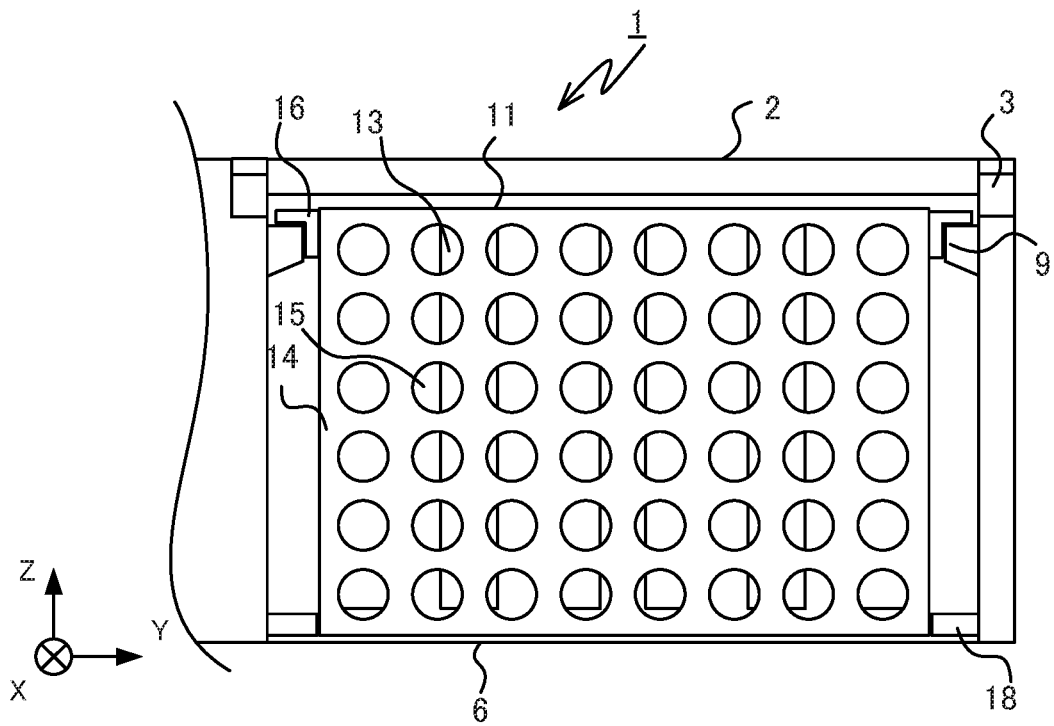
FIG. 17 is a front view of a vehicle control device according to Embodiment 4 of the present disclosure.

FIG. 17 is a front view of a vehicle control device according to Embodiment 4 of the present disclosure. In addition to the configuration of the control device 1 according to Embodiment 1, the control device 1 according to Embodiment 4 is further equipped with a shielding member 18 that projects in the Y-axis direction from the vertical-direction lower-most portion of each of the two surfaces of the housing 2 opposing each other in the Y-axis direction and on which the guides 9 are arranged, and the shielding member 18 blocks the flow passage of the air from the vertical-direction lower side of the housing 2 toward the space between the cooling unit 11 and the housing 2. The difference between the vertical-direction position of the vertical-direction lower side surface of the cooling unit 11 and this lower-most portion vertical-direction position is less than or equal to a threshold. By setting the threshold to a sufficiently small value, the vertical-direction position of the lower surface of the cooling unit 11 nearly matches the vertical-direction position of this lower-most portion. Thus the control device 1 according to Embodiment 4 can be installed even when the Z-direction length is limited in comparison to that of Embodiment 1.

Figure 18:
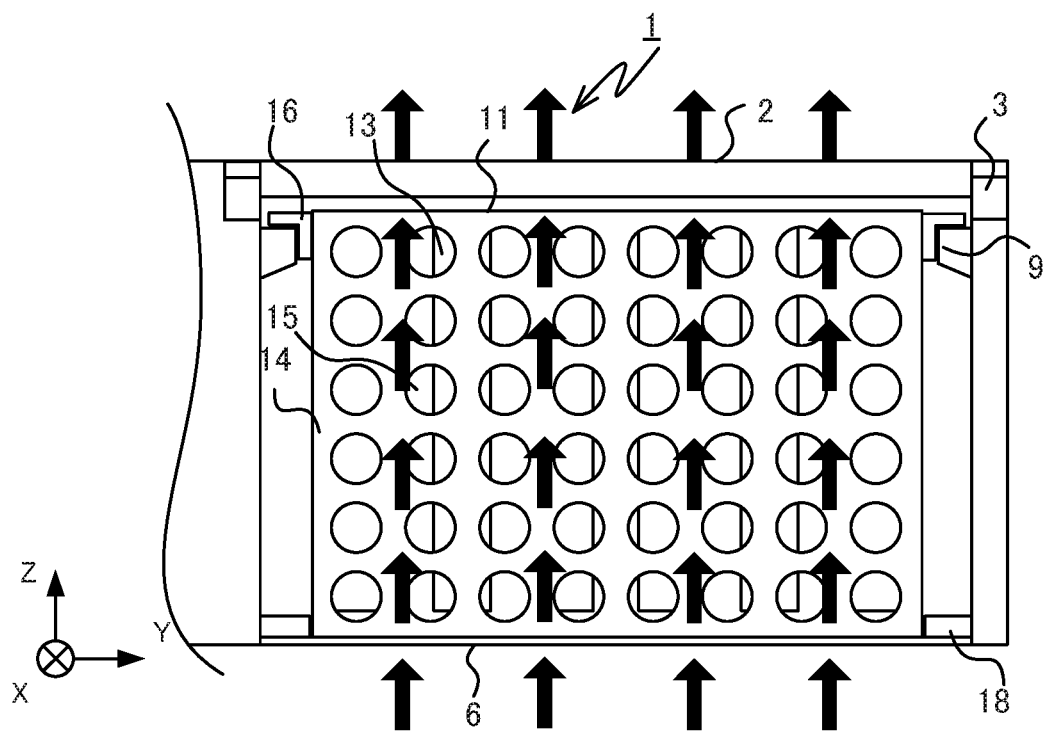
FIG. 18 is a drawing illustrating flow of air occurring in the vehicle control device according to Embodiment 4.

FIG. 18 is a drawing illustrating flow of air occurring in the vehicle control device according to Embodiment 4. Due to providing of the shielding member 18, in contrast to Embodiment 1, air does not flow between the cooling unit 11 and the housing 2. However, the air flowing into the first space 10 of the interior of the housing 2 from the inflow port 6 flows into the cooling unit 11, passes through the heat sink 13, is discharged from the cooling unit 11, and is discharged to the exterior of the housing 2 from the outflow port 7, thereby enabling cooling of the semiconductor element 17.

Due to the providing of the shielding member 18, the maximum Y-direction width of the elevating cart 30 is the Y-axis direction spacing of the shielding member 18. Although the Y-axis direction width of the elevating cart 30 is smaller in comparison to the case of Embodiment 1, the Y-axis direction width of the elevating cart 30 can be increased in comparison to the case in which the flange is provided for support of the weight of the cooling unit 11 at the vertical-direction lower side surface of the housing 2. Thus upsetting during moving of the elevating cart 30 carrying the cooling unit 11 can be suppressed.

In the same manner as that of the control device 1 according to Embodiment 1 illustrated in FIG. 4, in the example of FIG. 18, the vertical-direction position of the guide 9 is higher than the vertical-direction position of the center of mass of the cooling unit 11 in a state in which the cooling unit 11 is housed in the first space 10. Due to arrangement of the guide 9 at the upper portion of the surface of the housing 2 perpendicular to the Y-axis direction, there is no requirement for reinforcing the entire surface of the housing 2 perpendicular to the Y-axis direction, and the weight of the cooling unit 11 can be supported by reinforcing just a portion of the surface of the housing 2 perpendicular to the Y-axis direction. Due to reinforcing of just a portion of the surface of the housing 2 perpendicular to the Y-axis direction, manufacturing cost can be reduced. Further, in a manner similar to that of Embodiment 1, upsetting of the cooling unit 11 can be suppressed during moving of the cooling unit 11 in the first space 10 in the X-axis direction.

In a manner similar to that of the control device 1 according to Embodiment 1 illustrated in FIG. 10 and FIG. 11, the Z-axis direction positions of the guide 9 and the engaging member 16 can be freely determined for the control device 1 according to Embodiment 4.

As described above, according to the control device 1 of Embodiment 4 of the present disclosure, the engaging member 16 arranged on the cover 14 engages the guide 9 arranged on the surface of the housing 2, and thus arrangement of a flange at the surface of the vertical-direction lower side for supporting the weight of the cooling unit 11 is not required, and cooling capacity of the cooling unit 11 of the control device 1 can be improved. Further, the Y-axis direction width of the elevating cart 30, for which the maximum increase in width is up to the Y-axis direction spacing of the shielding member 18, can be increased, and upsetting during moving of the elevating cart 30 carrying the cooling unit 11 can be suppressed. There is no requirement for reinforcing the entire surface of the housing 2 perpendicular to the Y-axis direction in the case in which the vertical-axis position of the guide 9 is higher than the vertical-axis position of the center of gravity of the cooling unit 11 in a state in which the cooling unit 11 is housed in the first space 10, manufacturing cost can be reduced, and upsetting of the cooling unit 11 can be suppressed during moving of the cooling unit 11 in the first space 10 in the X-axis direction.

The present disclosure is not limited to the aforementioned embodiments. Multiple configurations among the aforementioned embodiments may be freely combined. For example, the surface perpendicular to the Y-axis of the cooling unit 11 according to Embodiment 2, similarly to the cooling unit 11 according to Embodiment 3, may be a surface in which the through hole 15 is not formed, and the shielded member 18 may be provided for the control device 1 according to Embodiments 2 and 3. Further, the shapes of the guide 9 and the engaging member 16 are not limited to the aforementioned shapes, and for example, the guide 9 may be a groove formed in the housing 2, and the engaging member 16 may be a projection extending in the attachment-detachment direction of the cooling unit 11 to engage the groove.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1 Vehicle control device
2 Housing
3 Hanging member
4 Open part
5 Partitioning member
6 Inflow port
7 Outflow port
8 Hole
9 Guide
10 First space
11 Semiconductor cooling unit
12 Base plate
13 Heat sink
14 Cover
15 Throughhole
16 Engaging member
17 Semiconductor element
18 Shielding member
20 Second space
30 Elevating cart

The invention claimed is:

1. A vehicle control device comprising:
a housing in which is formed an open part that has an opening surface disposed in a plane intersecting horizontal direction, to install on a vehicle;
a semiconductor cooling unit to be housed in a space of an interior of the housing and to detachably attach via the opening surface; and
a guide arranged on a surface of the housing enclosing the space, and having a shape extending in the direction of attachment-detachment of the semiconductor cooling unit;
a partitioning member to partition the interior of the housing into (a) a first space including the open part, and (b) a second space, having a main surface opposing the opening surface and having a hole formed therein; and
an electronic component housed in the second space, to connect electrically to a semiconductor element, wherein
an inflow port is formed in a lower side of the housing enclosing the space, for inflow of air from an exterior of the housing,
an outflow port is formed in an upper side of the housing enclosing the space, for discharge of air of the interior of the housing,
the semiconductor cooling unit comprises (a) a base plate to which the semiconductor element is attached, (b) a heat sink formed on the base plate on a side thereof facing the opening surface and opposite to a surface on which the semiconductor element is attached, the heat sink forming a vertically-directed flow passage for air inflowing from the inflow port, (c) a cover covering at least a portion of the heat sink, through holes being formed in at least a portion of the cover, and (d) an engaging member disposed on the cover and having a shape that extends in the attachment-detachment direction, to engage the guide and move along the guide in the attachment-detachment direction,
the semiconductor cooling unit is detachably attached in a direction in which the opening surface and the partitioning member face each other,
the inflow port is formed in a lower side of the housing enclosing the first space,
the outflow port is formed in an upper side of the housing enclosing the first space, and
in a state in which the semiconductor cooling unit is housed in the first space, the base plate is disposed covering the hole of the partitioning member in a state in which the semiconductor element is exposed to the second space from the hole of the partitioning member.

2. The vehicle control device according to claim 1, wherein
the guide is a pair of slide rails, each disposed on, among surfaces of the housing enclosing the space, a respective surface of two surfaces opposing each other in the horizontal direction, and
the engaging member is a pair of sliders to engage the pair of slide rails and to move on the slide rails in the attachment-detachment direction.

3. The vehicle control device according to claim 2, wherein
a vertical-direction position of the slide rail is higher than a vertical-direction position of a center of mass of the semiconductor cooling unit in the state in which the semiconductor cooling unit is housed in the space.

4. The vehicle control device according to claim 2, further comprising
a pair of shielding members, each of which projects in the horizontal direction from a vertical-direction lowermost portion of a respective surface of the pair of surfaces, opposing each other in the horizontal direction, on which the pair of slide rails is disposed, each shielding member blocking a flow passage of air from the vertical-direction lower side of the housing toward a gap between the semiconductor cooling unit and the housing, wherein
a difference between a vertical-direction position of a lower surface of the semiconductor cooling unit and a vertical-direction position of the lowermost portion is less than or equal to a threshold.

5. The vehicle control device according to claim 3, further comprising
a pair of shielding members, each of which projects in the horizontal direction from a vertical-direction lowermost portion of a respective surface of the pair of surfaces, opposing each other in the horizontal direction, on which the pair of slide rails is disposed, each shielding member blocking a flow passage of air from the vertical-direction lower side of the housing toward a gap between the semiconductor cooling unit and the housing, wherein
a difference between a vertical-direction position of a lower surface of the semiconductor cooling unit and a vertical-direction position of the lowermost portion is less than or equal to a threshold.

6. The vehicle control device according to claim 1, wherein the cover has two surfaces that oppose each other in the horizontal direction and are parallel in the attachment-detachment direction, and the through holes are formed in the two surfaces that oppose each other in the horizontal direction.

7. The vehicle control device according to claim 2, wherein the cover has two surfaces that oppose each other in the horizontal direction and are parallel in the attachment-detachment direction, and the through holes are formed in the two surfaces that oppose each other in the horizontal direction.

8. The vehicle control device according to claim 1, wherein
the guide is a slide rail disposed on an upper surface of the housing enclosing the space, and
the engaging member is a slider to engage the slide rail and move on the slide rail in the attachment-detachment direction.

9. The vehicle control device according to claim 1, wherein
the cover covers the entire heat sink, and the through holes are formed in all surfaces of the cover, and
a lower surface of the housing enclosing the space is an opening.

10. The vehicle control device according to claim 2, wherein
the cover covers the entire heat sink, and the through holes are formed in all surfaces of the cover, and
a lower surface of the housing enclosing the space is an opening.

11. The vehicle control device according to claim 3, wherein
the cover covers the entire heat sink, and the through holes are formed in all surfaces of the cover, and
a lower surface of the housing enclosing the space is an opening.

12. The vehicle control device according to claim 4, wherein
    the cover covers the entire heat sink, and the through holes are formed in all surfaces of the cover, and
    a lower surface of the housing enclosing the space is an opening.

\* \* \* \* \*